United States Patent
Iwai et al.

(10) Patent No.: US 10,000,864 B2
(45) Date of Patent: Jun. 19, 2018

(54) GROUP 13 ELEMENT NITRIDE CRYSTAL LAYER AND FUNCTION ELEMENT

(71) Applicant: NGK INSULATORS, LTD., Nagoya, Aichi-perfecture (JP)

(72) Inventors: Makoto Iwai, Kasugai (JP); Takashi Yoshino, Ama (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days. days.

(21) Appl. No.: 15/617,483

(22) Filed: Jun. 8, 2017

(65) Prior Publication Data

US 2017/0268125 A1    Sep. 21, 2017

Related U.S. Application Data

(63) Continuation of application No. PCT/JP2015/082614, filed on Nov. 19, 2015.

(30) Foreign Application Priority Data

Dec. 11, 2014   (JP) .................. 2014-250599

(51) Int. Cl.
  *C30B 29/40* (2006.01)
  *H01L 33/32* (2010.01)
  (Continued)

(52) U.S. Cl.
  CPC ............ *C30B 29/406* (2013.01); *C23C 16/34* (2013.01); *C30B 19/02* (2013.01); *C30B 19/12* (2013.01); *C30B 25/20* (2013.01); *H01L 33/32* (2013.01)

(58) Field of Classification Search
  CPC ....... C30B 29/406; C30B 19/02; C30B 19/12; C30B 25/20; H01L 33/32; C23C 16/34
  See application file for complete search history.

(56) References Cited

U.S. PATENT DOCUMENTS 4,082,889 A * 4/1978 DiStefano .............. C09K 11/08
  148/DIG. 120
4,230,508 A * 10/1980 Lindmayer ....... H01L 31/03682
  136/258

(Continued)

FOREIGN PATENT DOCUMENTS

JP       3631724 B2   12/2004
JP    2006-117530 A    5/2006
(Continued)

OTHER PUBLICATIONS

Yildiz et al., "Grain boundary related electrical transport in Al-rich Al x Ga1 − x N layers grown by metal-organic chemical vapor deposition", Semiconductors, Jan. 2011, vol. 45, Issue 1, pp. 33-36.*

(Continued)

*Primary Examiner* — Jonathan C Langman
(74) *Attorney, Agent, or Firm* — Cermak Nakajima & McGowan LLP; Tomoko Nakajima (57) ABSTRACT

A crystal layer of a nitride of a group 13 element includes a pair of main surfaces. The crystal layer includes high carrier concentration regions having a carrier concentration of $1 \times 10^{18}/cm^3$ or more and low carrier concentration regions having a carrier concentration of $9 \times 10^{17}/cm^3$ or less, viewed in a cross section perpendicular to the main surfaces of the crystal layer. Each of the low carrier concentration regions is extended in an elongated shape. The low carrier concentration regions include association parts. The low carrier concentration regions are extended continuously between the pair of the main surfaces.

11 Claims, 8 Drawing Sheets

(51) Int. Cl.
     *C23C 16/34*     (2006.01)
     *C30B 19/02*     (2006.01)
     *C30B 19/12*     (2006.01)
     *C30B 25/20*     (2006.01)

(56) References Cited

U.S. PATENT DOCUMENTS

| | | |
|---|---|---|
| 6,924,159 B2 | 8/2005 | Usui et al. |
| 7,794,543 B2 | 9/2010 | Motoki et al. |
| 8,207,054 B2 | 6/2012 | Shibata |

FOREIGN PATENT DOCUMENTS

| | | |
|---|---|---|
| JP | 3801125 B2 | 5/2006 |
| JP | 2008-060519 A | 3/2008 |
| JP | 2009-012986 A | 1/2009 |
| JP | 4396816 B2 | 10/2009 |

OTHER PUBLICATIONS

Irmer et al., "Carrier Concentration Profiles across GaP Grain Boundaries Observed by Raman Measurements", Phys. stat. sol. (a) vol. 106, 1988, pp. 549-553.*
"Development of GaN substrates," SEI Technical Review No. 175, Jul. 2009, pp. 10-18.
International Search Report and Written Opinion for PCT Patent App. No. PCT/JP2015/082614 (Dec. 28, 2015) with English translation of the ISR.
International Preliminary Report on Patentability for PCT Patent App. No. PCT/JP2015/082614 (Jun. 22, 2017).

* cited by examiner

GROUP 13 ELEMENT NITRIDE CRYSTAL LAYER AND FUNCTION ELEMENT

TECHNICAL FIELD

The present invention relates to a group 13 element nitride crystal layer and a functional element. The present invention can be applied, for example, to technical fields requiring high quality, more specifically, a blue LED with high color rendering properties expected to be the next-generation light source that can substitute for a fluorescent lamp, a blue-violet laser for a high-speed and high-density optical memory, a power device used in an inverter for a hybrid vehicle, and the like.

BACKGROUND ART

Recently, studies are actively conducted to produce semiconductor devices, such as a blue LED, a white LED, and a blue-violet semiconductor laser, using a group 13 element nitride such as gallium nitride, and to apply the resulting semiconductor devices to various electronic apparatuses.

With the expansion of the uses of the white LED, there has been an increasing demand for further improving performance of an LED chip. For the LED chip, improving performance means achieving high efficiency and high luminance.

The HVPE methods are well known methods for producing a gallium-nitride self-supporting substrate. Of these, the DEEP method (Patent document 1 and Non-patent document 1) and the VAS method (Patent documents 2 and 3) are disclosed as methods for obtaining high-quality crystals.

In a currently commonly used structure, in which a GaN thin film (a light-emitting part) is formed on a sapphire substrate using the MOCVD method, a dislocation density of the light-emitting part is extremely high in a range of $10^8$ to $10^9/cm^2$, thereby causing the non-radiative recombination of carriers in the dislocation regions. As such, it has been difficult to improve the light-emitting efficiency in such a structure.

On the other hand, the flux method is one of the liquid phase methods. For gallium nitride, the use of sodium metal as a flux can lower the temperature and pressure required for the crystal growth of gallium nitride to about 800° C. and several MPa, respectively. Specifically, nitrogen gas is dissolved in a mixed melt of sodium metal and gallium metal to bring gallium nitride into a supersaturated state, so that gallium nitride grows as crystals. In such liquid phase methods, dislocation hardly occurs as compared with the vapor phase methods, thereby allowing to obtain high-quality gallium nitride having a low dislocation density (Patent document 4).

Non-Patent Documents

NON-PATENT DOCUMENT 1: SEI Technical Review No. 175, July 2009, pages 10-18, "Development of GaN substrates"

Patent Documents

PATENT DOCUMENT 1: Japanese Patent No. 3801125B
PATENT DOCUMENT 2: Japanese Patent No. 3631724B
PATENT DOCUMENT 3: Japanese Patent No. 4396816B
PATENT DOCUMENT 4: Japanese Patent Publication No. 2009-012986A

SUMMARY OF THE INVENTION

A group 13 element nitride crystal layer is required to have high conductivity to produce a LED and a laser diode. Thus, the inventor attempted to increase the conductivity of the crystal layer by doping dopants, such as Si and oxygen, to the crystal layer in order to increase the output.

However, even when the conductivity of the above-mentioned crystal layer was actually improved, for example, by increasing a current in a vertically structured LED, a phenomenon was observed in which the light output was not increased.

An object of the present invention is to provide a group 13 element nitride crystal layer having a desired conductivity and to effectively utilize the conductivity of the crystal layer to improve its function.

The present invention provides a crystal layer comprising a nitride of a group 13 element and a pair of main surfaces:
    said crystal layer comprising high carrier concentration regions having a carrier concentration of $1 \times 10^{18}/cm^3$ or more and low carrier concentration regions having a carrier concentration of $9 \times 10^{17}/cm^3$ or less present in a cross section perpendicular to said main surfaces of said crystal layer;
    wherein each of said low carrier concentration regions is extended in an elongated shape;
    wherein said low carrier concentration regions comprises association parts; and
    wherein said low carrier concentration regions are extended continuously between said pair of said main surfaces.

Further, the present invention provides a composite substrate comprising:
    a seed crystal comprising a nitride of a group 13 element and; said crystal layer of said nitride of said group 13 element provided over said seed crystal.

Further, the present invention provides a functional device comprising:
    said crystal layer of said nitride of said group 13 element; and
    a functional layer comprising a nitride of a group 13 element and provided over one of said main surfaces of said crystal layer.

High conductivity is required for producing, for example, a vertically structured LED and a laser diode. However, it turned out to be difficult to dope dopants, such as Si and oxygen, in the group 13 element nitride crystals such as GaN in a manner such that the dopants were evenly applied into the whole surface of the wafer in order to impart conductivity. Further, regions with more dopants exhibited deterioration in crystallinity and had the increased dislocation density.

As a result of the detailed investigation of the mechanism of the current leakage described above, it was found that regions exhibiting higher conductivity, in a cross-sectional structure of the group 13 element nitride crystal layer, had deteriorated crystallinity and facilitated the flow of current, thus causing a local current concentration, which resulted in the occurrence of the current leakage. Specifically, the microscope thermography could successfully detect a temperature rise in the location where the current concentration occurred.

An increase in the density of the current applied to an LED chip causes a reduction in the light-emitting efficiency and this phenomenon has been known as efficiency droop. It has been reported that the efficiency droop is caused by carrier over flow, non-radiative recombination, Auger recombination, and the like. However, these phenomena are observed in a laterally structured LED.

The above-mentioned phenomenon discovered by the inventor is different from the efficiency droop phenomenon and has not been reported at all before. Thus, this is a new finding made by the inventor. Based on the above observation, the occurrence of the local current concentration has been discovered for the first time by the current studies.

Based on the finding, the present inventors successfully formed a cross-sectional structure of the crystal layer, in which the low carrier concentration regions are formed into a net-like shape and the high carrier concentration regions are surrounded by the low carrier concentration regions having the net-like shape, by improving crystal growth conditions. The inventors further successfully suppressed the current leakage between the pair of the main surfaces of the crystal layer by obtaining such a cross-sectional structure. This can suppress the current leakage caused by increasing the voltage applied to the crystal layer, thereby enabling to effectively utilize the conductivity of the crystal layer to improve its function.

BRIEF DESCRIPTION OF THE DRAWINGS

FIG. 3 (a) is a schematic diagram showing the condition of a cross section of the crystal layer of the present invention and FIG. 3(b) is a schematic view showing the condition of a cross section of a crystal layer according to a comparative example.

EMBODIMENTS FOR CARRYING OUT THE INVENTION

Hereinafter, the present invention will be described further in detail while appropriately referring to the drawings.

Figure 1A:
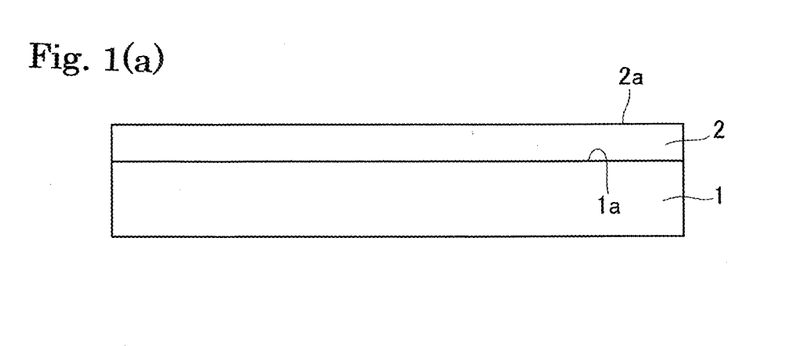
FIG. 1(a) is a schematic diagram showing a group 13 element nitride crystal layer 2 formed on seed crystal 1, FIG. 1 (b) is a schematic view showing a composite substrate 4, and FIG. 1 (c) is a schematic view showing a functional element 15 formed by arranging a functional element structure 5 on the composite substrate 4.
Figure 1B:
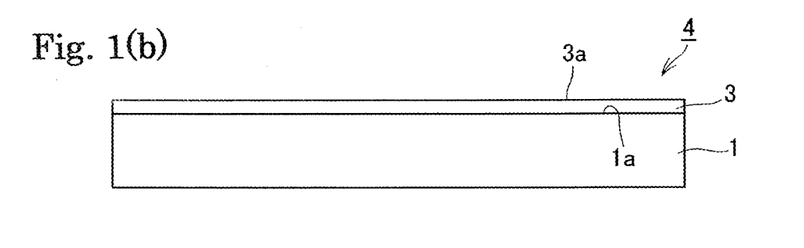

In a preferred embodiment, as shown in FIG. 1(a), a group 13 element nitride crystal layer 2 is formed on a surface 1a of a seed crystal 1 made of a group 13 element nitride. Next, an upper main surface 2a of the crystal layer 2 is preferably subjected to a lapping processing to obtain a thinner crystal layer 3 shown in FIG. 1(b), thereby obtaining a composite substrate 4. The lapped main surface is denoted as 3a.

Figure 1C:
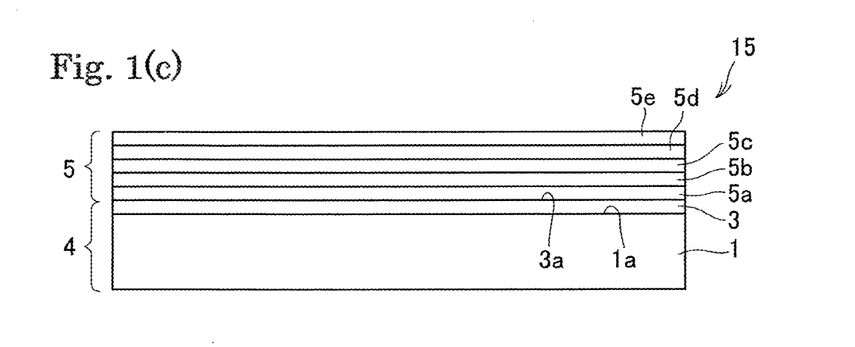

A functional layer 5 is formed on the surface 3a of the composite substrate 4 thus obtained by the vapor phase method to obtain a functional element 15 (FIG. 1(c)). Note that 5a, 5b, 5c, 5d, and 5e are epitaxial layers grown on the main surface 3a, and they are designed according to the application.

It is noted that it is not necessary to lap the main surface 2a of the group 13 element nitride crystal layer 2 before forming the functional layer 5, and the growth surface can be used as it is. Further, the functional layer 5 may be formed on the main surface of the crystal layer 3 after producing the composite substrate 4 in FIG. 1(b) and then removing the seed crystal 1 by a grinding processing, a lift-off method, or the like.

(Seed Crystal)

In the present invention, the seed crystal is not particularly limited as long as they can grow the group 13 element nitride crystal layer. The Group 13 element herein refers to a group 13 element in the periodic table determined by IUPAC. Specific examples of the group 13 element include gallium, aluminum, indium, thallium, and the like. As the group 13 element nitride, GaN, AlN, and AlGaN are particularly preferable.

The seed crystal may form a self-supporting substrate (a supporting substrate) by itself or may be a seed crystal film formed on a separate supporting substrate. The seed crystal film may be formed in a single layer or contain a buffer layer on the side of the supporting substrate.

The vapor growth methods are preferably used to form the seed crystal film, and examples of the methods include a metal organic chemical vapor deposition (MOCVD) method, a hydride vapor phase epitaxy (HVPE) method, a pulse excited deposition (PXD) method, an MBE method, and a sublimation method. The metal organic chemical vapor deposition method is particularly preferable. Further, the growth temperature is preferably 950 to 1200° C.

When the seed crystal film is formed on the supporting substrate, a material of the single crystal constituting the supporting substrate is not limited. Nevertheless, examples of the material include sapphire, an AlN template, a GaN template, a GaN self-supporting substrate, a silicon single crystal, a SiC single crystal, an MgO single crystal, spinel ($MgAl_2O_4$), $LiAlO_2$, $LiGaO_2$, a perovskite-type mixed oxide, such as $LaAlO_3$, $LaGaO_3$, and $NdGaO_3$, and SCAM ($ScAlMgO_4$). Also, it is possible to use a perovskite-type mixed oxide of a cubic crystal system represented by a composition formula $[A_{1-y}(Sr_{1-x}Ba_x)_y] [(Al_{1-x}Ga_z)_{1-u} \cdot D_u] O_3$ (where A is a rare-earth element; D is one or more elements selected from the group consisting of niobium and tantalum; y=0.3 to 0.98; x=0 to 1; z=0 to 1; u=0.15 to 0.49; and x+z=0.1 to 2).

The growth direction of the group 13 element nitride crystal layer may be a normal direction of the c-plane of the wurtzite crystal structure, or a normal direction of the a-plane or the m-plane.

A dislocation density of the surface of the seed crystal is preferably low, from the standpoint of reducing a dislocation density of the group 13 element nitride crystal layer arranged on the seed crystal. From the same standpoint, the dislocation density of the seed crystal is preferably $7 \times 10^8 cm^{-2}$ or less, further preferably $5 \times 10^8 cm^{-2}$ or less. Further, the lower limit of the dislocation density of the seed crystal is not particularly limited since it should be as low as possible in terms of the quality, however, the lower limit is commonly set to $5 \times 10^7 cm^{-2}$ or more in many cases.

(Group 13 Element Nitride Crystal Layer)

A production method of the crystal layer is not particularly limited. However, examples of such a method include the vapor phase methods, such as a metal organic chemical vapor deposition (MOCVD) method, a hydride vapor phase epitaxy (HVPE) method, a pulse excited deposition (PXD) method, an MBE method, and a sublimation method, and the liquid phase methods, such as a flux method.

In the group 13 element nitride constituting the crystal layer, the group 13 element refers to a group 13 element in the periodic table determined by IUPAC. Specific examples of the group 13 element include gallium, aluminum, indium, thallium, and the like. As the group 13 element nitride, GaN, AlN, and GaAlN are particularly preferable. Further, examples of an additive include carbon, metal having a low melting point (tin, bismuth, silver, and gold), and metal having a high melting point (transition metal such as iron, manganese, titanium, and chromium).

Figure 3A:
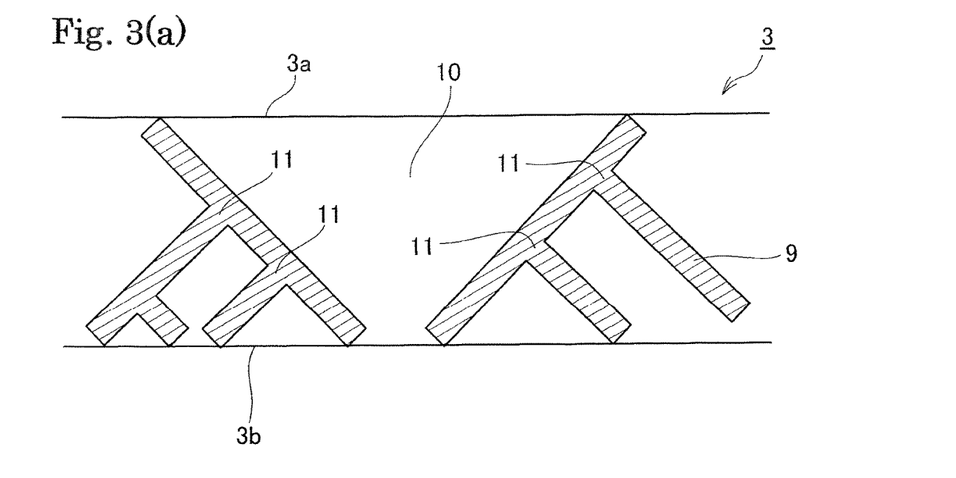

The present invention, as exemplified in the schematic diagram of FIG. 3, defines a structure of the cross section (the cross section of FIG. 3), substantially perpendicular to the pair of the main surfaces $3a$ and $3b$ between them, of the crystal layer 3 made of the group 13 element nitride. In the present example, an explanation is given for the lapped crystal layer 3, however, the same applies to the crystal layer 2 that is not lapped.

Specifically, high carrier concentration regions 10 having a carrier concentration of $1\times10^{18}/cm^3$ or more and low carrier concentration regions 9 having a carrier concentration of $9\times10^{17}/cm^3$ or less are present in the cross section perpendicular to the main surfaces of the crystal layer.

In the high carrier concentration regions 10, the current easily flow when the voltage is applied, thus the conductivity of the crystal layer can be improved. From this viewpoint, the carrier concentration in the high carrier concentration regions is set to preferably $3\times10^{18}/cm^3$ or more, more preferably $5\times10^{18}/cm^3$ or more.

However, the carrier concentration in the high carrier concentration regions can be practically set to $1\times10^{19}/cm^3$ or less.

Further, combining with the low carrier concentration regions enables to suppress a leak current from concentrating in the high carrier concentration regions between the pair of the main surfaces of the crystal layer, whereby a reduction in function of the crystal layer can be suppressed. From this viewpoint, the carrier concentration in the low carrier concentration regions is set to preferably $9\times10^{17}/cm^3$ or less, more preferably $5\times10^{17}/cm^3$ or less.

However, the carrier concentration in the low carrier concentration regions can be practically set to $2\times10^{17}/cm^3$ or more.

It is noted that, when the dopants are an n-type dopant (Si, Ge, oxygen, etc.), the activation rate is high at 98% or more, thus the dopant concentration can be treated as being approximately equal to the carrier concentration, although they are not exactly the same. Hereafter, the term "carrier concentration" is used in the description from the viewpoint of the present invention preventing the leakage caused by the current concentration, however, "carrier concentration" may be interpreted as "dopant concentration" considering that the activation rate is almost 100%.

In the present invention, the low carrier concentration regions 9 are extended in an elongated shape and associated with each other at association parts 11. The elongated low carrier concentration regions 9 are connected in a net-like structure to represent a unique morphology. This unique morphology can suppress the concentration of the leak current while securing sufficient conductivity in the high carrier concentration regions 10.

Further, in the present invention, the low carrier concentration regions 9 are extended continuously between the pair of the main surfaces $3a$ and $3b$. This can improve the conductivity of the crystal layer. This does not mean that every low carrier concentration region 9 is required to be extended continuously between the pair of the main surfaces. Rather, it is sufficient that at least a part of the low carrier concentration regions 9 is extended continuously between the pair of the main surfaces.

Figure 3B:
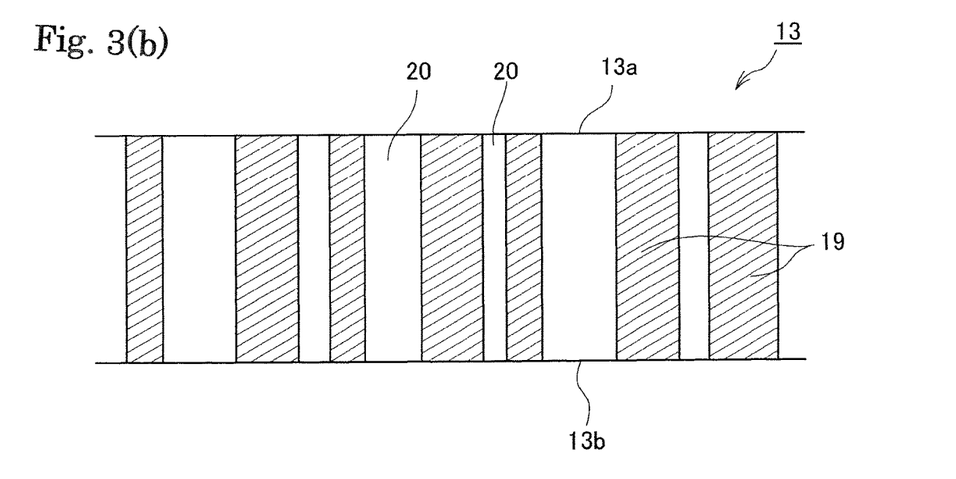

On the other hand, in a crystal layer 13 of a comparative example shown in FIG. 3(b), high carrier concentration regions 20 and low carrier concentration regions 19 are, for example, alternately arranged between a pair of main surfaces $13a$ and $13b$. Each of the high carrier concentration regions 20 and the low carrier concentration regions 19 is extended continuously between the pair of the main surfaces $13a$ and $13b$. It was found that a crystal growth performed by the vapor phase methods and the conventional flux was more likely to have such a structure. It was found that, in this structure, an increase in the voltage applied between the pair of the main surfaces $13a$ and $13b$ caused the concentration of the leak current in the high carrier concentration regions 20 and, for example, failed to improve the emission intensity.

In the present invention, the high carrier concentration regions and the low carrier concentration regions are measured as follows to be identified.

A cathodoluminescence measuring device (e.g., MP series manufactured by HORIBA, Ltd.) is used under the conditions of a magnification of 50 to 500 times and an image shooting area of 0.1 to 1 mm square.

The low carrier concentration regions 9 being in an elongated shape means that a height/width ratio of each of the low carrier concentration regions is 2 or more, further preferably 5 or more.

In a preferred embodiment, the low carrier concentration regions form a continuous phase in a net-like shape in the cross section perpendicular to the main surfaces of the crystal layer, and the high carrier concentration regions are partitioned by the low carrier concentration regions.

Figure 4:
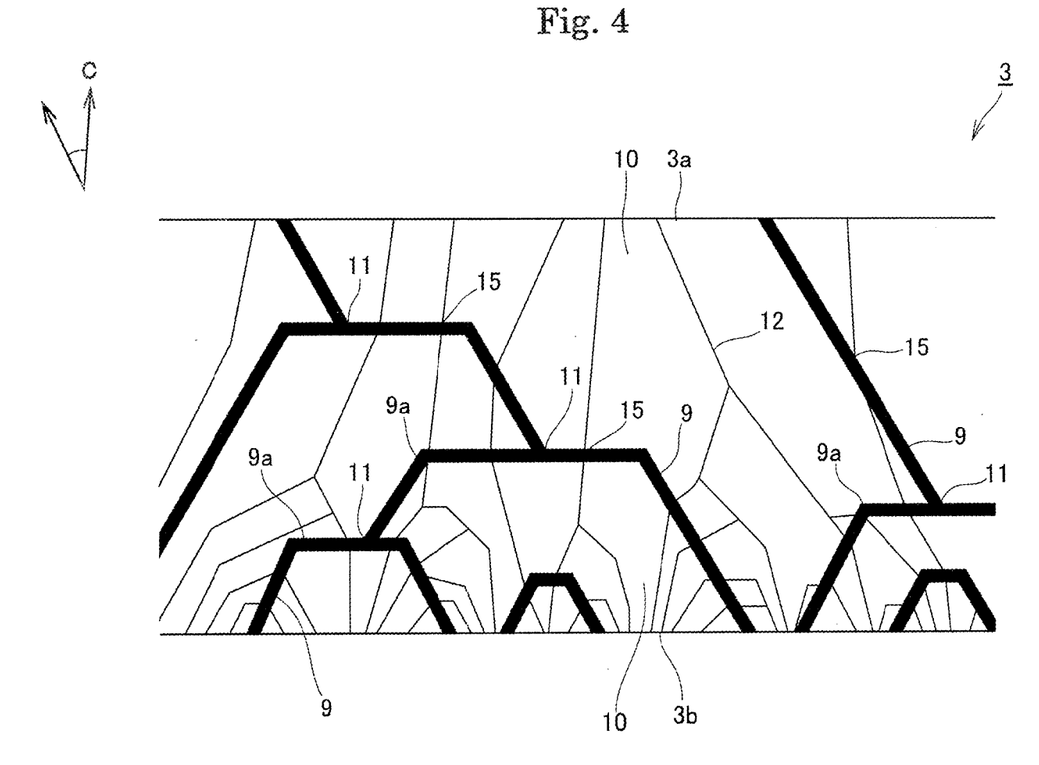
FIG. 4 is a schematic diagram showing the condition of a cross section of a crystal layer according to an example of the present invention, the crystal layer including crystal defects.

In an example shown in FIG. 4, the low carrier concentration regions 9 form a continuous phase in a net-like shape and the high carrier concentration regions 10 are partitioned by the low carrier concentration regions 9.

It is noted that, although the continuous phase means that the low carrier concentration regions 9 are continuously formed, every low carrier concentration region 9 is not required to be perfectly continuously formed, and a part of the low carrier concentration regions 9 may be separated from the other low carrier concentration regions.

Further, the high carrier concentration regions 10 preferably form a dispersed phase. The dispersed phase herein means that the high carrier concentration regions 10 are generally partitioned by the low carrier concentration regions 9 and divided into a number of regions which are not mutually connected. It is noted that, although the high carrier concentration regions 10 are separated by the low carrier concentration regions in the cross section of the crystal layer, the high carrier concentration regions may be continuously formed on the surface of the crystal layer.

In a preferred embodiment, crystal defects are present in the cross section perpendicular to the main surfaces of the crystal layer and the crystal defects cross the low carrier concentration regions. For example, in the schematic diagram of FIG. 4, crystal defects 12 are extended between the pair of the main surfaces $3a$ and $3b$. The crystal defects 12, then, intersect and cross the low carrier concentration regions 9. The intersecting parts of the crystal defects 12 and the low carrier concentration regions 9 are denoted as 15. Growth inflection points of the low carrier concentration regions are denoted as 9a.

The crystal defects described herein refer to threading dislocations, which are divided into three classes, namely, screw dislocation, edge dislocation, and mixed dislocation in which the former two dislocations are mixed. These dislocations can be confirmed by a transmission electron microscope (TEM) or cathodoluminescence (CL).

The crystal defects 12 are extended from the lower main surface 3b in contact with the seed crystal toward the upper main surface 3a in accompaniment to the growth of the crystal while being associated with each other. The dopants exhausted in accompaniment to the growth of the crystals tend to accumulate in the crystal defects, thus the crystal defects tend to have high conductivity. The structure in which the crystal defects 12 cross the low carrier concentration regions 9 can suppress the concentration of the leak current.

Figure 5:
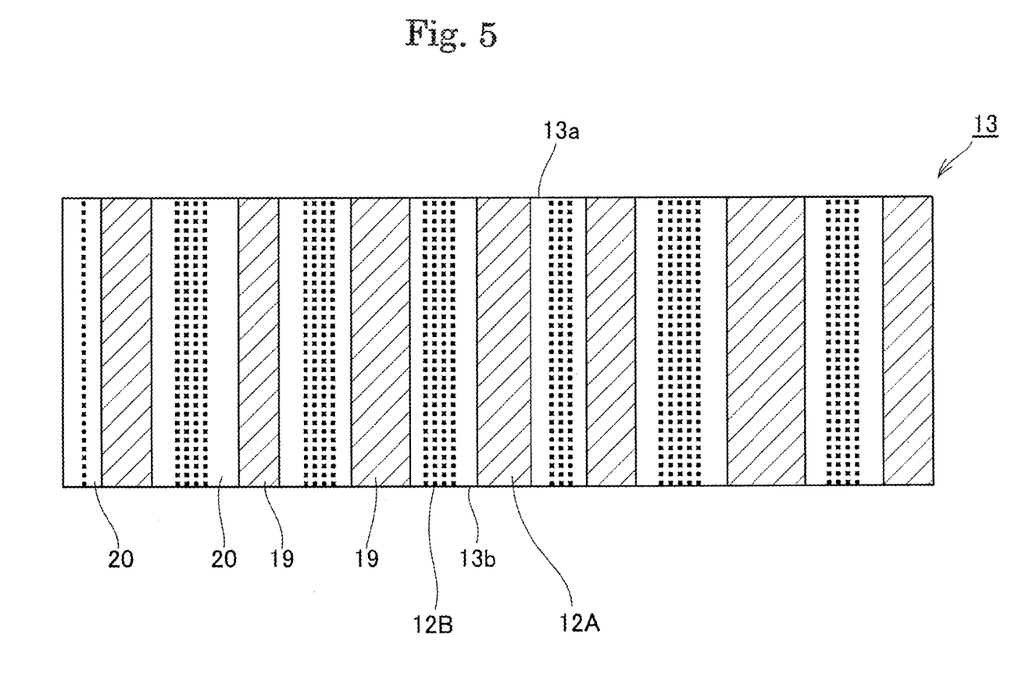
FIG. 5 is a schematic diagram showing the condition of a cross section of the crystal layer according to the comparative example, the crystal layer including crystal defects.

For example, in a comparative example shown in FIG. 5, crystal defects 12A and crystal defects 12B are formed in high carrier concentration regions 20 and low carrier concentration regions 19, respectively. However, both crystal defects are extended in the vertical direction between the pair of the main surfaces just as the carries rather than forming a structure in which the crystal defects cross the elongated low carrier concentration regions.

Further, there are more crystal defects 12B in the high carrier concentration regions 20. This is because, in the structure in which the crystals grow into a pillar shape from the bottom to the top, the carriers and the crystal defects tend to increase in the regions with many dopants. In such a structure, the concentration of the leak current is more likely to occur in the high carrier concentration regions.

In a preferred embodiment, the low carrier concentration region 9 contains a part inclined by 30 to 60° with respect to a C-axis of the group 13 element nitride.

In a particularly preferred embodiment, the group 13 element nitride crystal layer is grown by the flux method. In this case, a type of the flux is not particularly limited as long as it can produce the group 13 element nitride. In a preferred embodiment, a flux containing at least one of alkali metal and alkaline earth metal is used, and a flux containing sodium metal is particularly preferable.

The flux is mixed with a raw material of the group 13 element when used. As the raw material, simple metal, an alloy, or a compound may be applied, however, the simple metal of the group 13 element is preferable from the standpoint of handling.

(Example of Growth Control of Group 13 Element Nitride Crystal Layer)

Herein exemplified is a preferred control method for growing the group 13 element nitride crystal layer of the present invention.

When the flux method is used, it is preferred that, at the initial stage, the growth in the vertical direction is promoted by keeping a supersaturation degree as low as possible, and the crystal growth is performed by only using the concentration gradient as a driving force to the extent possible by suppressing the convection of the melt.

Specifically, the growth at the initial stage is preferably performed by the following method.

(1A) The average growth temperature of the melt in a crucible is set higher to reduce the supersaturation degree and suppress the formation of nuclei 6 (FIG. 2).

(2A) The temperature in the upper part of the crucible is set higher than the temperature in the lower part of the crucible to suppress the convection of the melt in the crucible.

(3A) The melt is not stirred or the stirring speed is reduced.

(4A) The partial pressure of the nitrogen-containing gas is reduced.

In this manner, at the initial stage, the formation of the nuclei 6 is suppressed and the crystals are grown upward from the nuclei 6 (arrow C).

In a preferred embodiment, the growth conditions used at the initial stage are stopped and changed to increase the crystal growth speed (the later stage). As a result, crystal growth 7 is mainly carried out in lateral directions (arrows A and B).

For example, the following conditions can be applied.
(Initial stage)
(1A) The average growth temperature of the melt in the crucible is set to 870 to 885° C.
(2A) The temperature in the upper part of the crucible is set higher than the temperature in the lower part of the crucible by 0.5 to 1° C.
(3A) The melt is not stirred or the stirring speed is set to 30 rpm or less. Further, the stirring direction is limited to one direction.
(4A) The partial pressure of the nitrogen-containing gas is set to 3.5 to 3.8 MPa.

The conditions are preferably set as follows at the later stage.
(1B) The average growth temperature of the melt in the crucible is set to 850 to 860° C. Further, the difference in the average growth temperatures between the initial stage and the later stage is set to 10 to 25° C.
(3B) The melt is stirred and the stirring direction is periodically changed. Further, when the stirring direction is changed, the rotation of the crucible is stopped. In this case, the rotation stop time is preferably 100 seconds to 6000 seconds, further preferably 600 seconds to 3600 seconds. Further, the rotation time and the rotation speed before and after the rotation stop time are preferably 10 seconds to 600 seconds and 10 to 30 rpm, respectively.
(4B) The partial pressure of the nitrogen-containing gas is set to 4.0 to 4.2 MPa. Further, the partial pressure of the nitrogen-containing gas is set higher than that at the initial stage by 0.2 to 0.5 MPa.

It is preferred that the production conditions are gradually changed to keep a balance between the low dislocation regions and the carrier concentrations at the later stage. As a specific example, the stirring speed of the melt is gradually increased and/or the holding time at the maximum rotational speed during the stirring is gradually increased.

In the flux method, a single crystal is grown in an atmosphere including gas containing nitrogen atoms. The gas is preferably nitrogen gas, but it may be ammonia gas.

There is no limitation to gas other than the gas containing nitrogen atoms in the atmosphere, however, inert gas is preferable, and argon, helium, and neon are particularly preferable.

At the initial stage of the growth, the above conditions (1A) to (4A) are preferably held for 1 hour or longer, further preferably for 2 hours or longer. Further, the holding time at the initial stage is preferably 10 hours or shorter.

The ratio (molar ratio) of the group 13 element nitride/the flux (e.g., sodium) in the melt is preferably set high from the viewpoint of the present invention, and it is preferably 18 mol % or more, further preferably 25 mol % or more.

However, when this ratio becomes too high, the crystal quality tends to be deteriorated. Thus, the ratio is preferably 40 mol % or less.

(Vapor Phase Method)

Figure 2A:
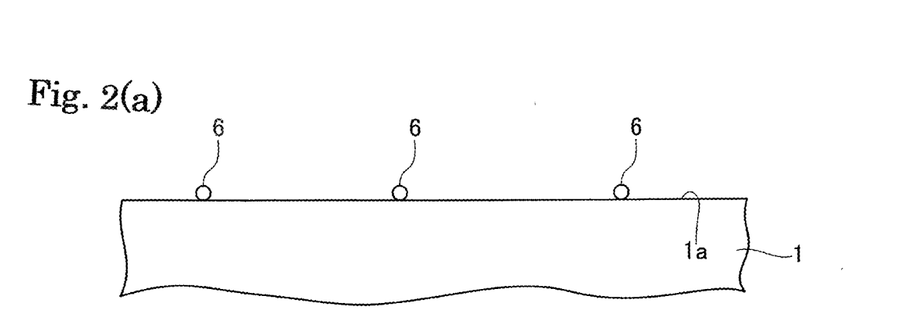
FIG. 2(a) is a schematic diagram showing nuclei 6 formed on the seed crystal 1 and FIG. 2(b) is a schematic view showing growth directions of the nuclei 6.
Figure 2B:
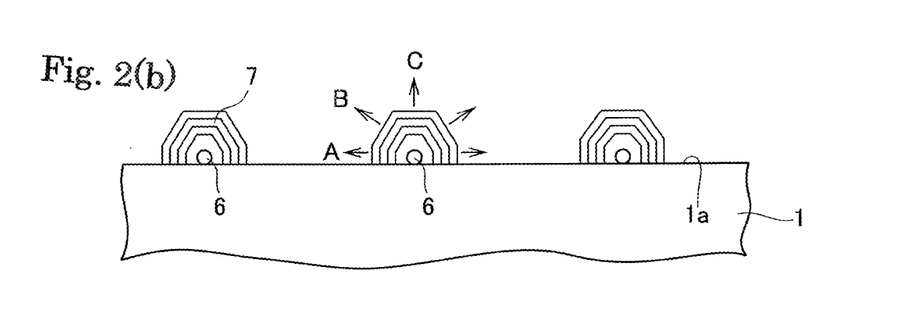

In the HVPE method, for example, the mixing ratio of hydrogen is set higher (e.g., 50% or more) to slow down the growth speed (e.g., 10 to 20 microns/hr) at the initial stage of the growth, so that the growth proceeds from the state shown in FIG. 2(a) to the state shown in FIG. 2(b), in which the crystals are preferentially grown in the direction of the arrow C. Subsequently, the mixing ratio of hydrogen is reduced (e.g., 30% or less) to increase the VIII ratio (e.g., 2000 or more), so that the growth proceeds to the state shown in FIG. 2(b), in which the crystals are preferentially grown in the directions of the arrows A and B.

The group 13 element nitride grown by the flux method emits the broad fluorescence (blue fluorescence) having a peak at 440 to 470 nm wavelength, when irradiated with light having wavelength of 330 to 385 nm (e.g., light from a mercury lamp). On the other hand, the group 13 element nitride grown by the vapor phase methods emits the broad fluorescence (yellow fluorescence) having a peak at 540 to 580 nm wavelength, when irradiated with the light having wavelength of 330 to 385 nm. Thus, it is possible to distinguish between the group 13 element nitride made by the flux method and the group 13 element nitride made by the vapor phase methods by the fluorescence color emitted by the irradiation of the light having wavelength of 330 to 385 nm.

(Processing and Shape of Crystal Layer)

In a preferred embodiment, the group 13 element nitride crystal layer is formed in a disk shape, however, it may be formed in other shapes, such as a rectangle shape. Further, in a preferred embodiment, the crystal layer has a diameter of 25 mm or more. In this manner, the crystal layer, which is suitable for the mass production of the functional element and easy to handle, can be provided.

An explanation will be given regarding the case in which the surface of the group 13 element nitride crystal layer is subjected to grinding and lapping processes.

The grinding is a process in which a surface of an object is ground by being contacted with a rapidly rotating fixed abrasive that has abrasive grains fixed on the contacting surface by a bond. Performing the grinding in this manner forms the rough surface. When the grinding is applied to the bottom surface of the gallium nitride substrate, it is preferable to use the fixed abrasive, which contains the abrasive grains formed from SiC, $Al_2O_3$, diamond, CBN (cubic boron nitride, the same applies hereafter) and the like having a high hardness, and having a grain diameter of about 10 microns or more and 100 microns or less.

Further, the lapping is a process in which a surface of an object is polished by bringing a surface plate and the object, which are rotated relatively to each other, into contact with each other through free abrasive grains (referring to abrasive grains that are not fixed, the same applies hereafter) or by bringing the fixed abrasive and the object, which are rotated relatively to each other, into contact with each other. Performing the lapping in this manner forms the surface having roughness smaller than that of the surface formed by the grinding and greater than that of the surface formed by polishing. It is preferable to use the abrasive grains formed from SiC, $Al_2O_3$, diamond, CBN and the like having a high hardness, and having a grain diameter of about 0.5 microns or more and 15 microns or less.

The polishing is a process in which a surface of an object is delicately polished and smoothed by bringing a grinding pad and the object, which are rotated relatively to each other, into contact with each other through the free abrasive grains or by bringing the fixed abrasive and the object, which are rotated relatively to each other, into contact with each other. Performing the polishing in this manner forms the crystal growth surface having roughness smaller than that of the surface formed by the lapping.

(Functional Layer and Functional Element)

The functional layer mentioned above may be formed in a single layer or contain a plurality of layers. Further, in functional terms, it may be used as a white LED with high luminance and high color rendering properties, a blue-violet laser disk for a high-speed and high-density optical memory, a power device used in an inverter for a hybrid vehicle, and the like.

When a semiconductor light emitting diode (LED) is produced on the group 13 element nitride crystal layer by the vapor phase methods, preferably by the metal organic chemical vapor deposition (MOCVD) method, the dislocation density inside the LED becomes comparable with that of the crystal layer.

The film-forming temperature of the functional layer is preferably 950° C. or higher, further preferably 1000° C. or higher, from the viewpoint of, for example, suppressing the incorporation of unnecessary impurities, such as carbon. Further, the film-forming temperature of the functional layer is preferably 1200° C. or lower, further preferably 1150° C. or lower, from the viewpoint of suppressing the occurrence of the defects.

A material of the functional layer is preferably the group 13 element nitride. The group 13 element herein refers to a group 13 element in the periodic table determined by IUPAC. Specific examples of the group 13 element include gallium, aluminum, indium, thallium, and the like.

A light-emitting element structure comprises, for example, an n-type semiconductor layer, a light-emitting region provided on the n-type semiconductor layer, and a p-type semiconductor layer provided on the light-emitting region. In a light-emitting element 15 shown in FIG. 1(c), an n-type contact layer 5a, an n-type clad layer 5b, an active layer 5c, a p-type clad layer 5d, and a p-type contact layer 5e are formed on the composite substrate 4 to constitute a light-emitting element structure 5.

Further, the above-mentioned light-emitting structure may further comprise an electrode for n-type semiconductor layer, an electrode for p-type semiconductor layer, a conductive adhesive layer, a buffer layer, a conductive support body, and the like, all not illustrated.

In the present light-emitting structure, light is emitted in the light-emitting region by recombination of holes and electrons injected from the semiconductor layers and extracted from the side of a translucent electrode or the group 13 element nitride crystal layer of the p-type semiconductor layer. It is noted that the translucent electrode refers to a light-transmitting electrode made from a thin metal film or a transparent conductive film, formed almost on the whole surface of the p-type semiconductor layer.

A material of the semiconductor constituting the n-type semiconductor layer and the p-type semiconductor layer is made of a group III-V compound semiconductor and can be exemplified as follows.

$Al_yIn_xGa_{1-x-y}N$ (0≤x≤1, 0≤y≤1)

As a doping material for imparting n-type conductivity, silicon, germanium, and oxygen can be exemplified. Further, as a doping material for imparting p-type conductivity, magnesium and zinc can be exemplified.

As a growth method of the semiconductor layers constituting the light emitting structure, various kinds of the vapor phase growing methods can be mentioned. For example, the metal organic chemical vapor deposition (MOCVD, also called MOVPE) method, the molecular beam epitaxy (MBE) method, the hydride vapor phase epitaxy (HVPE) method, and the like may be used. Of these, the MOCVD method enables to obtain the semiconductor layers with excellent crystallinity and flatness. In the MOCVD method, an alkyl metal compound, such as TMG (trimethyl gallium), TEG (triethyl gallium), or the like, is frequently used as a Ga source and gas, such as ammonia, hydrazine, or the like, is used as a nitrogen source.

The light-emitting region includes a quantum well active layer. A material of the quantum well active layer is designed so that the band gap is made smaller than those of the materials of the n-type semiconductor layer and the p-type semiconductor layer. The quantum well active layer may have a single quantum well (SQW) structure or a multi quantum well (MQW) structure. The material of the quantum well active layer can be exemplified as follows.

Preferred examples of the quantum well active layer include the one having the MQW structure obtained by repeating the stack of an $Al_xGa_{1-x}N/Al_yGa_{1-y}N$-based quantum well active layer (x=0.15, y=0.20) with a film thickness of 3 nm/8 nm three to ten times.

EXAMPLES

Example 1

(Production of Seed Crystal Substrate)

A low temperature GaN buffer layer was deposited to 20 nm at 530° C. on a c-face sapphire substrate having a diameter of 2 inches and a thickness of 500 microns (the substrate having an off angle of 0.5 degrees in the a-axis direction was selected) by the MOCVD method. Then, a GaN film having a thickness of 2 μm was laminated at 1050° C. on the buffer layer. The defect density was $1\times10^9/cm^2$ as measured by TEM observation. The laminated substrate was cleaned ultrasonically in an organic solvent and ultrapure water for 10 minutes each and then dried to obtain a seed crystal substrate.

(GaN Crystal Growth by Liquid Phase Method)

Ga metal and Na metal were weighed in a molar ratio of 27:73 inside a glove box filled with inert gas and placed onto the bottom of an alumina crucible together with the seed crystal substrate. Ge was added in an amount of 0.8 mol % with respect to the amount of Ga for imparting conductivity. Three of such crucibles were stacked on each other and placed into a stainless-steel holding vessel (a reaction vessel). Four of the reaction vessels each containing the crucibles stacked in a plurality of stages were further stacked on each other and placed into a stainless-steel holding vessel (an inner vessel). The inner vessel was placed on a turntable arranged inside a pressure vessel that had been vacuum-baked, and the pressure vessel was covered with a lid to be sealed. Then, the pressure in the pressure vessel was reduced to 0.1 Pa or less by a vacuum pump. It is noted that the inner vessel and the internal inner vessels used in the present test are described in Patent document 4.

Next, a heater installed inside the pressure vessel was turned on to melt source materials in the crucibles and form a Ga—Na mixed melt. While heating the crucibles to a temperature of 880° C., nitrogen gas was introduced from a nitrogen gas cylinder to achieve a pressure of 4.0 MPa to start the growth of crystals (the initial stage). Under these temperature and pressure conditions, the crystals hardly grow due to a low supersaturation degree. Under these growth conditions without actively stirring, nuclei were formed by repeating the local growth and melt back. After 5 hours, GaN crystals having a size of about 2 μm were grown.

Subsequently, the crucible temperature was decreased to 850° C. by taking 20 minutes and the crucible pressure was increased to 4.0 MPa, in the same time, the stirring was started by continuously reversing the rotational direction of the turntable to change a mode of the crystal growth. The rotation conditions were set such that the turntable was rotated around the central axis at a rotation speed of 20 rpm with the rotation direction periodically inverted between the clockwise and counterclockwise directions. The acceleration time was set to 6 seconds; the holding time, 200 seconds; the deceleration time, 6 seconds; the stop time, 1 second. Such conditions were held for 1 hour. This stage caused the grain growth and the nuclei gradually grew while being associated with each other. After this stage, the inversion frequency was changed (the holding time was slowly increased to 1,000 seconds by taking 15 hours) without changing the acceleration time, the deceleration time, and the stop time (the later stage). Under these conditions, the grains further grew while being associated with each other. During this stage, the thickness of the GaN crystals increased by about 120 μm. Subsequently, the crucibles were cooled down to the room temperature and the grown gallium nitride crystal plates were recovered.

Each of the gallium nitrides grown on the seed crystal substrates in the crucibles stacked in 12 stages was measured for thickness to find that the minimum thickness was about 110 microns, the maximum thickness was about 130 microns, the average thickness was 120 microns, and the standard deviation was 7 microns. Thus, there was a small variation in the thickness.

The surface of the gallium nitride crystal plate was subjected to the lapping process to adjust the thickness to 100 μm, and then the dark spot density was measured by the cathodoluminescence method. The result was $2\times10^6/cm^2$.

Figure 6:
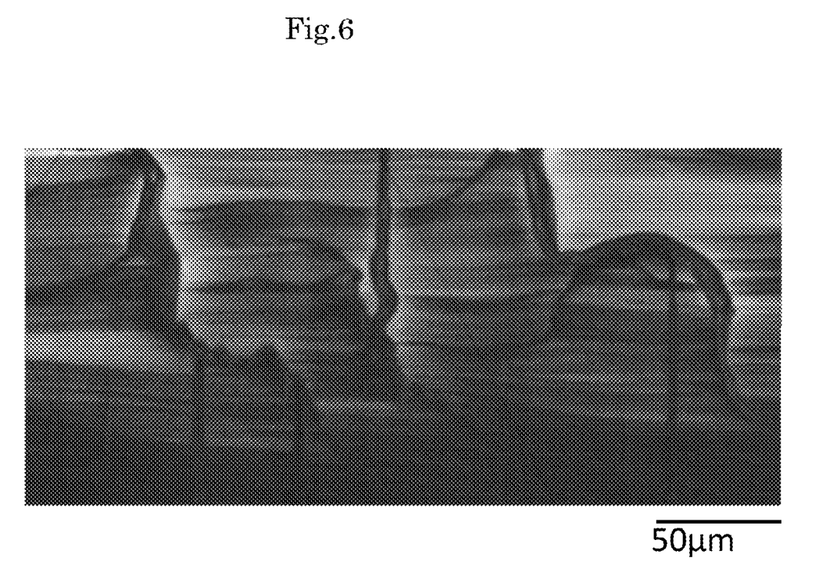
FIG. 6 is a cathodoluminescence image showing a cross section of the crystal layer according to the example of the present invention.
Figure 7:
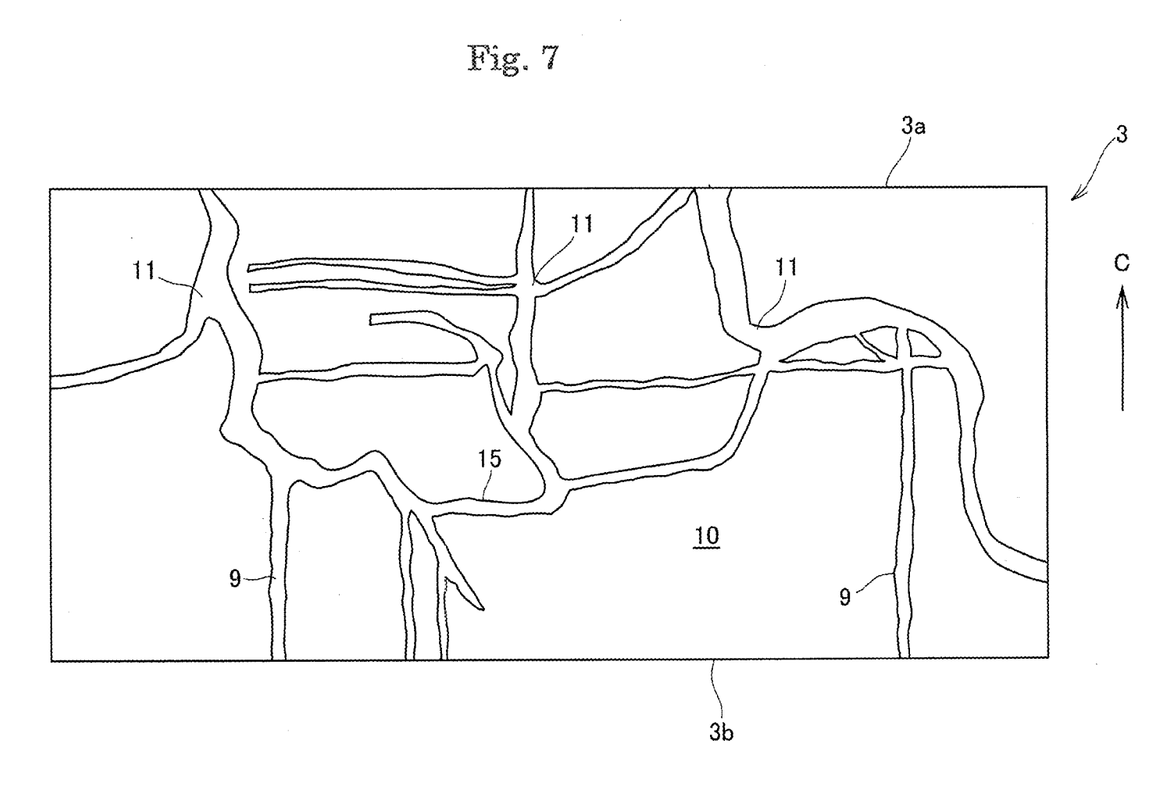
FIG. 7 is a schematic diagram explaining FIG. 6.

Next, a cross section of the gallium nitride crystal plate was observed by the cathodoluminescence. The resulting observation image is shown in FIG. 6 and a schematic diagram of this observation image is shown in FIG. 7. Darker regions (gray parts) 9 indicate the regions having the low carrier concentration. Elongated parts of the darker regions are extended to form a continuous phase. The linear parts extended in an elongated manner (the low carrier concentration regions) 9 include parts inclined by 30 to 60° with respect to the c-axis. Brighter regions (white parts) indicate the regions having the high carrier concentration and these white parts (the high carrier concentration regions) 10 are surrounded by the gray parts to form a dispersed phase. It was found that the low carrier concentration regions 9 grew along the grain boundaries and intersected the crystal defects (the dislocation dense regions).

Four samples (four carrier concentrations of $1\times10^{17}/cm^3$, $5\times10^{17}/cm^3$, $1\times10^{18}/cm^3$, and $5\times10^{18}/cm^3$), of which the carrier concentrations were previously measured by the eddy current method, were subjected to the CL measurement and the brightness of the obtained images was evaluated at 8 bits (255 gradations) by an image processing to create a calibration curve expressing the relationship between the carrier concentrations and the brightness of the CL images.

The carrier concentrations were calculated using the calibration curve. As a result, the carrier concentration of the high carrier concentration regions was determined to be $2\times10^{18}/cm^3$ and the carrier concentration of the low carrier concentration regions was determined to be $5\times10^{17}/cm^3$. Further, 6 mm square samples were prepared and subjected to the Hall measurement to find that the (average) carrier concentration of the 6 mm square regions was $1.5\times10^{18}/cm^3$.

Further, when the obtained gallium nitride crystal plate was irradiated with light having wavelength of 330 to 385 nm from a mercury lamp, the gallium nitride crystal plate emitted the broad fluorescence (blue fluorescence) having a peak at 440 to 470 nm.

A film of the blue LED structure was formed by the MOCVD method using the gallium nitride crystal layer on the sapphire. A comb-shaped p-type electrode pattern (1 mm square) was formed on the film and then the sapphire substrate was separated by the laser lift-off technique. After the separation surface was lapped flatly, an n-type electrode was formed. The laminate was cut by laser dicing into 1 mm square chips to produce a vertically structured LED chip. According to the measurement, the LED chip driven at a current of 350 mA had a high internal quantum efficiency of about 80%. The emission intensity was uniformly distributed within the surface. Further, according to the measurement, the LED chip maintained a high internal quantum efficiency of 65% even when the driving current was increased to 1000 mA. Further the LED chip had the low leak current of 0.01 µA when 2V voltage was applied.

Comparative Example 1

The same test was performed as in Example 1 except that, in the later stage, the acceleration time was fixed to 6 seconds; the holding time was fixed to 600 seconds, the deceleration time was fixed to 6 seconds, and the stop time was fixed to 1 second.

Figure 8:
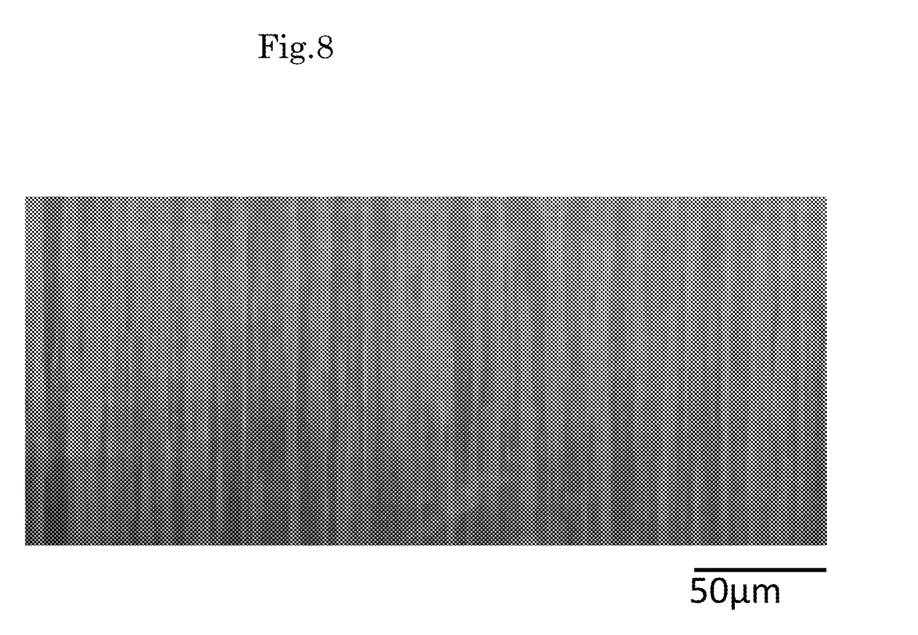
FIG. 8 is a cathodoluminescence image showing a cross section of the crystal layer according to the comparative example.

The cross-section observation of the GaN crystals was performed by the cathodoluminescence method in the same manner as in Example 1 to obtain the image shown in FIG. 8. Specifically, each of the white parts and the gray parts were extended in a pillar shape along their growth directions and did not intersect. A number of black lines, considered to be the dislocation lines (crystal defects), were observed in each of the white parts. On the other hand, the dislocation lines were observed only sparsely in the gray parts.

According to the measurement, the LED chip driven at a current of 350 mA had a relatively high internal quantum efficiency of about 75%, however, the emission intensity was not uniformly distributed within the surface. Further, according to the measurement, when the driving current was increased to 1000 mA, the internal quantum efficiency drop to 55% and the unevenness of the emission intensity became further obvious. Further, the leak current at the time of applying 2V voltage was 1 mA, which was higher than that obtained in Example 1.

Thus, it was speculated that the defect concentration parts, which were observed as the white parts, caused the leakage.

Comparative Example 2

The hydride VPE method was performed using gallium chloride (GaCl), a reaction product of gallium (Ga) and hydrogen chloride (HCl), as a group III material, and ammonia ($NH_3$) gas as a group V material. The sapphire substrate, on which a GaN film (thickness of 2 microns) was formed by the MOCVD method, was set in a hydride VPE growth apparatus and heated to the growth temperature of 1000° C. under an ammonia atmosphere. After the growth temperature was stabilized, HCl was supplied at a flow rate of 40 cc/min, and then $NH_3$ and silane ($SiH_4$) were supplied at flow rates of 1000 cc/min and 0.01 cc/min, respectively, to grow n-type GaN crystals.

After holding for 3 hours, the GaN crystals were cooled down to the room temperature under the ammonia gas atmosphere and taken out from the growth apparatus. The GaN crystals grew by about 200 microns.

The cross-section observation of the GaN crystals was performed by the cathodoluminescence method in the same manner as in Example 1. The result was shown in FIG. 5 as a schematic diagram.

Each of the white parts (the high carrier concentration regions) 20 and the gray parts (the low carrier concentration regions) 19 were extended in a pillar shape along their growth directions and did not intersect. A number of black lines, considered to be dislocation lines (crystal defects) 12B, were observed in the high carrier concentration regions. On the other hand, dislocation lines (crystal defects) 12A were observed only sparsely in the low carrier concentration regions.

Further, when the obtained gallium nitride crystal plate was irradiated with light having wavelength of 330 to 385 nm from a mercury lamp, the gallium nitride crystal plate emitted the broad fluorescence (yellow fluorescence) having a peak at 540 to 580 nm.

An LED was produced in the same manner as in Example 1 and subjected to the measurement of the internal quantum efficiency with the driving current of 350 mA to find a relatively high value of about 70%. However, the emission intensity was not uniformly distributed within the surface. Further, according to the measurement, when the driving current was increased to 1000 mA, the internal quantum efficiency drop to 50% and the unevenness of the emission intensity became further obvious. Further, the leak current at the time of applying 2V voltage was 2 mA, which was higher than that obtained in Example 1.

Thus, it was speculated that the defect concentration parts observed as the white parts (the high carrier concentration regions) caused the leakage.

The invention claimed is:

1. A crystal layer comprising a nitride of a group 13 element and a pair of main surfaces:
    said crystal layer comprising high carrier concentration regions having a carrier concentration of $1\times10^{18}/cm^3$ or more and low carrier concentration regions having a carrier concentration of $9\times10^{17}/cm^3$ or less present in a cross section perpendicular to said main surfaces of said crystal layer;
    wherein each of said low carrier concentration regions is extended in an elongated shape;
    wherein said low carrier concentration regions comprises association parts; and
    wherein said low carrier concentration regions are extended continuously between said pair of said main surfaces.

2. The crystal layer of claim 1, comprising crystal defects present in said cross section perpendicular to said main surfaces of said crystal layer, wherein said crystal defects cross said low carrier concentration regions.

3. The crystal layer of claim 1, wherein said low carrier concentration regions form a continuous phase in a net-like shape and said high carrier concentration regions are partitioned by said low carrier concentration regions in said cross section perpendicular to said main surfaces of said crystal layer.

4. The crystal layer of claim 1, wherein said low carrier concentration regions include parts inclined by 30 to 60° with respect to a C-axis of said nitride of said group 13 element.

5. The crystal layer of claim 1, wherein said crystal layer emits a fluorescence having a peak in a wavelength of 440 to 470 nm, provided that a light of a wavelength of 330 to 385 nm is irradiated thereto.

6. The crystal layer of claim 1, wherein said crystal layer emits a fluorescence having a peak in a wavelength of 540 to 580 nm, provided that a light of a wavelength of 330 to 385 nm is irradiated thereto.

7. The crystal layer of claim 1, wherein at least one of said main surfaces is a lapped surface.

8. A composite substrate comprising a seed crystal comprising a nitride of a group 13 element and said crystal layer of claim 1, said crystal layer being provided over said seed crystal.

9. A functional element comprising said crystal layer of claim 1 and a functional layer comprising a nitride of a group 13 element, said functional layer being formed over one of said main surfaces of said crystal layer.

10. The functional element of claim 9, wherein said functional layer has a light-emitting function.

11. The functional element of claim 9, further comprising a seed crystal comprising a nitride of a group 13 element, wherein said crystal layer is provided over said seed crystal.

\* \* \* \* \*